United States Patent [19]

Iwasa

[11] Patent Number: 4,592,052
[45] Date of Patent: May 27, 1986

[54] METHOD OF TESTING BUBBLE MEMORY DEVICES

[75] Inventor: Seiichi Iwasa, Sagamihara, Japan

[73] Assignee: Fujitsu Limited, Kawasaki, Japan

[21] Appl. No.: 560,172

[22] Filed: Dec. 12, 1983

[30] Foreign Application Priority Data

Dec. 27, 1982 [JP] Japan .................................. 57-234834

[51] Int. Cl.$^4$ .......................... G06F 13/00; G01R 33/12
[52] U.S. Cl. ........................................ 371/21; 365/201
[58] Field of Search .................... 324/210; 365/201, 2, 365/1, 28, 6, 15, 49; 371/27, 21, 24; 364/900, 200

[56] References Cited

U.S. PATENT DOCUMENTS

| | | | |
|---|---|---|---|
| 4,221,003 | 9/1980 | Chang | 364/900 |
| 4,233,668 | 10/1980 | Yamaguchi et al. | 365/1 |
| 4,234,935 | 11/1980 | Schreiner | 365/2 |
| 4,400,809 | 8/1983 | Whitinger | 371/27 |
| 4,414,646 | 11/1983 | Boutin | 365/2 |
| 4,456,974 | 6/1984 | Cooper | 365/1 |
| 4,459,549 | 7/1984 | Iwasa | 365/201 |

*Primary Examiner*—Michael R. Fleming
*Attorney, Agent, or Firm*—Staas & Halsey

[57] ABSTRACT

A method of testing bubble memory devices each having a plurality of minor loops, the method being useful for detecting defective minor loops in a short time. In this method, data to be written in and/or data to be read out is divided into and stored as a plurality of blocks, the bubble memory device is sequentially operated under driving magnetic field and/or bias magnetic field conditions different for every block, and a defective minor loop or loops are detected by comparing readout data with write-in data.

15 Claims, 15 Drawing Figures

METHOD OF TESTING BUBBLE MEMORY DEVICES

BACKGROUND OF THE INVENTION (1) Field of the Invention

The present invention relates to a method of testing bubble memory devices. More particularly, it relates to a method of detecting defective loops of a magnetic bubble memory device having a plurality of minor loops.

(2) Description of the Prior Art

Before describing a conventional method of testing bubble memory devices, an explanation is given of a general magnetic bubble memory device with reference to FIGS. 1 and 2.

As is illustrated in FIG. 1, a general magnetic bubble memory device comprises a memory chip 2 mounted on an insulating base 1, an XY coil 3, thin plate magnets 4, ferrite yokes 5, pin terminals 6, and a shield case 7. The XY coil 3 applies a rotating magnetic field to the memory chip and effects, for example, the transfer of magnetic bubbles. The thin plate magnets 4 and the ferrite yokes 5 apply a bias magnetic field to the memory chip 2 in order to stably retain the magnetic bubbles in the memory chip. The memory chip 2 comprises a layer of magnetic material formed on a substrate of, for example, GGG (gadlium galium garnet), conductor patterns of, for example, AU or Al-Cu alloy formed on the layer of magnetic material, and transfer patterns of, for example, permalloy, formed on the conductor patterns.

FIG. 2 illustrates a schematic circuit structure of a general magnetic bubble memory device. In FIG. 2, reference numeral 8 designates a bubble generator which comprises a conducting pattern 9 indicated by the broken lines. Reference numeral 10 designates a write-in major line having one end formed on the conducting pattern 9 of the bubble generator 8. The write-in major line 10 comprises, for example, half disc-shaped permalloy patterns. Reference numeral 11 designates a minor loop which is coupled to the write-in major line 10 via swap gates 12 and to a readout major line 13 via replicate gates 14. Reference numeral 15 designates a detector which is coupled to an end of the readout major line 13. The minor loops 11 and the readout major line 13 also comprise, for example, half disc-shaped permalloy patterns.

In the memory device of FIG. 2, when the writing in of bubble signals is effected, the bubble signals generated by the bubble generator 8 are transmitted through the write-in major line 10, in series, by a driving magnetic field from the XY coils. When magnetic bubbles of the bubble signals are transmitted to the corresponding bit positions of the write-in major line 10 associated with the positions of the minor loops 11, a swap pulse is applied from a swap-conducting pattern 16 to the swap gates 12, thereby transferring, in parallel, the bubble signals on the write-in major line 10 to the minor loops 11.

When the reading out of the bubble signals is effected, a replicate pulse is applied from a replicate-conducting pattern 17 to the replicate gates 14, and magnetic bubbles stored in the minor loops 11 adjacent to the replicate gates are transferred, in parallel, to the readout major line 13. The magnetic bubbles on the readout major line 13 are transmitted to the detector 15, in series, and are converted into readout signals which are output from output conductors 18.

With reference to FIGS. 3 through 5, a conventional method of testing bubble memory devices is explained.

The characteristics of a bubble memory device are shown in FIG. 3, in which the driving magnetic field HD is plotted on the abscissa and the bias magnetic field HB is plotted on the ordinate. The margin curve 20 is drawn, and, ordinarily, the hatched range is an operation region. At delivery inspection in a manufacturing plant or the like, instead of drawing the margin curve 20 to determine the operation region, there is adopted a window test method in which, as is shown in FIG. 3, the driving magnetic field and bias magnetic field are changed to several points (1), (2), . . . on the coordinates X and Y to check the operation within a region defined by these points, whereby the test time is shortened. In devices having a major-minor loop structure or a block replicator structure; that is, in bubble memory devices having a plurality of minor loops, which are widely used at present, if there are some defective minor loops, precise detection of the defective loops occupies a major portion of the test time. When a defective loops is detected, this is displayed on the device so that the loop is not used and only the normal minor loops are used; thus, increasing the yield.

Whether or not a minor loop is defective depends on the driving magnetic field and the bias magnetic field and on the bubble information pattern within minor loops interreaction occurs among bubbles. The test apparatus shown in FIG. 4 is ordinarily used for the detection of defective loops. In FIG. 4, reference numeral 22 designates a bubble memory device, reference numeral 24 designates a control circuit for a bias magnetic field applied to the device 22, and reference numeral 26 designates a driving circuit for coils X and Y for a rotating magnetic field applied to the device 22. Reference numeral 28 designates a system control circuit, reference numeral 30 designates a circuit for generating a write information pattern, and reference numeral 32 designates a gate pulse driving circuit. By using these elements, predetermined bubbles are generated and are driven by the rotating magnetic field generated by the coils X and Y. Refernce numeral 34 designates a circuit for detecting readout information, and reference numeral 36 designates a comparing circuit for comparing the output of the pattern-generating circuit 30 (that is, the information written into the device 22), with the output of the detecting circuit 34; that is, the information read out from the device 22. When these two outputs coincide with each other, the device 22 is judged as being normal. When they do not coincide with each other, the device 22 is judged as being abnormal, and the defective minor loop is detected from the position of the bit where the discrepancy appears.

This discrepancy, that is, a propagation error, can be generated by various factors. These factors include, for example, whether or not the bubble generator precisely generates bubbles; whether or not the bubbles are precisely transferred into the minor loops from the major loop and the writing gate, i.e., the swap gate; whether or not the bubbles are normally transferred among the minor loops; whether or not the readout gate, i.e., the replicate gate, prcisely reads the bubbles from the minor loops; and whether or not the major loop precisely transfers these bubbles to the bubble detector. The respective intensities of the bias magnetic field HB, and of the driving magnetic field HD are related to these factors, and certain portions of the device (loops, gates, and so on) operate normally under certain combinations of HB and HD [conditions (1), (2), ... in FIG. 3], but these portions operate erroneously under other combinations of HB and HD. Accordingly, in the conventional sequence for detection of detective loops, writing, transferring, reading, and comparing are carried out for every driving magnetic field and bias magnetic field condition, as is shown in FIG. 5.

More specifically, information to be written is first generated by the bubble generator, and the transfer gates or swap gates are actuated to transfer this information to the minor loops (writing in). Then, bubbles (written information) are propagated in the minor loops. In this case, start-stop operations (intermittent driving) are ordinarily carried out simultaneously so that the bubbles pass through all of the bits in the loops (minor loop transfer). Then the transfer gates or block replicators are actuated to transfer the bubbles to the major loop, and the corresponding signals are read out by the detector (readout). Finally the written information is compared with the readout information, and the loop where the written information and the readout information do not coincide with each other is judged as being defective.

The number of minor loops indicates the number of bits in a page and the bit number within the minor loop indicates the page number. In the above example, the latter number is 2,048; that is, the number of bits in each minor loop. Bubbles corresponding to the number of bits in a page are generated, and the writing and reading of these bubbles are repeated a number of times corresponding substantially to the number of pages (conditions are most strict when bubbles are stored in all of the pages). An example of the simplest test sequence is shown in FIG. 5. Practically, however, a more complicated test sequence is used. In a typical practical test sequence, the reading operation is repeated, or, after the writing sequence minor loop transferring and reading are repeated several times while changing the write information pattern, writing, reading, and comparing information operations are carried out.

When a detective loop is detected according to the conventional method as was pointed out above, the defect depends greatly on the driving magnetic field, the bias magnetic field, and the bubble information pattern within the minor loop. Therefore, after bubble information is stored in substantially all of the pages and every point of the driving magnetic field and the bias magnetic field shown in FIG. 3 is exercised per the sequence of FIG. 5, it is necessary to take the logic sum of the defective loops detected at the respective points and indicate the defective loops of the bubble memory device. For example, in the case where a 1-megabit device is tested at a driving frequency of 100 KHz, about 12 seconds (10 $\mu S \times 600 \times 2,048$) are necessary for writing, about three seconds are necessary for the minor loop transfer inclusive of the stopping and starting operations, and about 12 seconds (10 $\mu S \times 600 \times 2,048$) are necessary for reading. Therefore, even if the window test shown in FIG. 3 is executed using the simplest sequence, 216 seconds $\{(12+3+12) \times 8\}$ are required to test the device.

SUMMARY OF THE INVENTION

It is an object of the present invention to provide a method for testing bubble memory devices by which the bubble memory devices can be tested under various conditions in a short time.

The present invention is based on the following facts. Namely, the bubble memory device is a serial element, unlike a core memory or IC memory. Therefore, bubble information of one page passes through all of the bit positions of all of the minor loops in the memory device. Also, bubbles written under different conditions (driving magnetic field and bias magnetic field conditions) are not influenced by these conditions and cannot be distinguished from bubbles written under other conditions when all bubbles are placed under the same conditions. Furthermore, the write-read test is mainly a test at the gate portions and a defect in the gate portions can be detected without transferring the bubbles of all of the pages.

Accordingly, since a defective loop depends greatly on the bubble information pattern in the minor loop, the state where bubbles are written substantially in all of the pages is realized during the test for detecting a defective loop. According to the present invention, bubble information is written into and readout of substantially all of the pages. This information is divided into a plurality of blocks. The writing and the reading operations are carried out under driving magnetic field conditions and/or bias magnetic field conditions which are differnet for the respective blocks. The information within the respective minor loops is transferred within the individual pages, in parallel and under various conditions. Then the written information and read information are compared, whereby defective loops can be detected precisely in much less time than the time required in the conventional method.

According to the present invention, there is provided a method of testing a bubble memory device having a plurality of minor loops, characterized in that data to be written in and/or data to be read out is divided into a plurality of blocks, the bubble memory device is sequentially operated under driving magnetic field and/or bias magnetic field conditions different for every block, and a defective minor loop or loops are detected by comparing readout data with write-in data.

DESCRIPTION OF THE PREFERRED EMBODIMENTS

The embodiments of the present invention will now be described in detail with reference to the drawings.

FIGS. 6A through 8C illustrate the principle of detection of defective loops in accordance with the present invention. A bubble memory device of 4 loops ×16 bits (total capacity: 64 bits) is taken as an example, and a window test is carried out at the eight points shown in FIG. 3. In FIGS. 6A through 8C, L1 through L4 designate first to fourth minor loops, G designates a bubble generator, WM designates a write-in major line, S designates a swap gate, R designates a replicator, RM designates a readout major line, and D designates a bubble detector. The basic operations of these members are as discussed above. The generator G generates bubbles according to write-in data, and the generated bubbles are transferred on the major line WM by the driving field. When bubbles are generated for all of the minor loops, four minor loops in this example, the swap gates are opened and the bubbles on the major line WM are transferred to the minor loops L1 through L4. By the operation of the swap gates S, bubbles are simultaneously transferred to the major line WM from the minor loops L1 through L4, but these bubbles are propagated on the major line WM and are expelled onto a guard rail (not shown). Alternatively, no bubbles are present on the minor loops at this point, and, hence, no bubbles are transferred to the major line WM. The bubbles transferred to the minor loops L1 through L4 are driven by the driving magnetic field and are circulated on the minor loops L1 through L4. On reading, the replicators R are actuated to replicate bubbles in the replicator portions of the minor loops (if there are bubbles in this portion). The replicated bubbles are transferred on the major line RM by the driving magnetic field and applied to the detector where they are detected.

Figure 1:
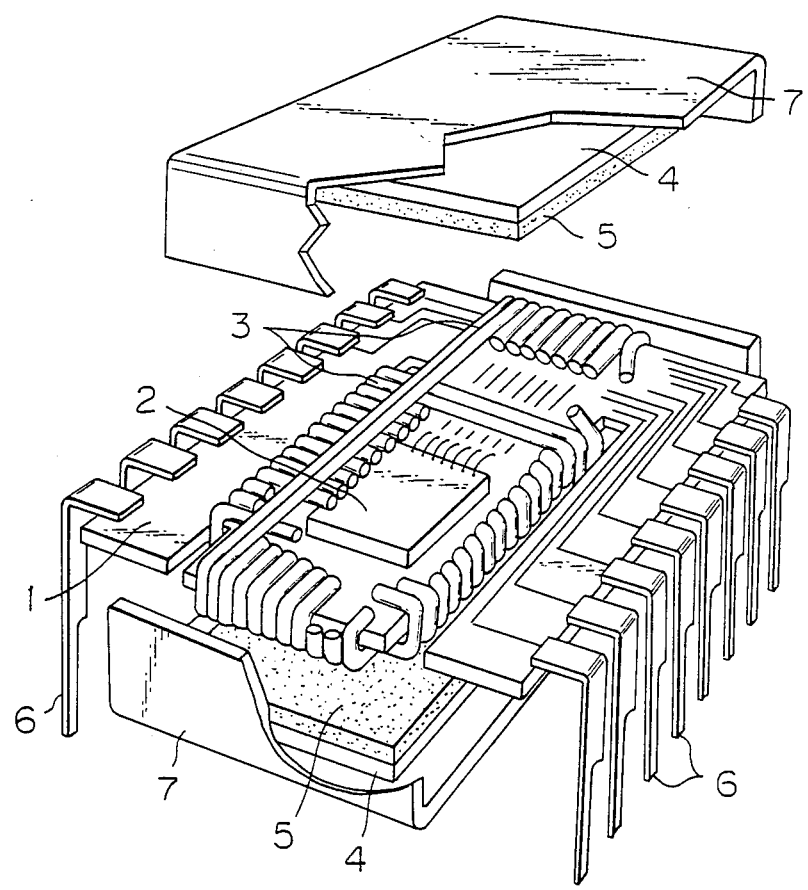
FIG. 1 is a perspective view of the structure of a general magnetic bubble memory device.
Figure 2:
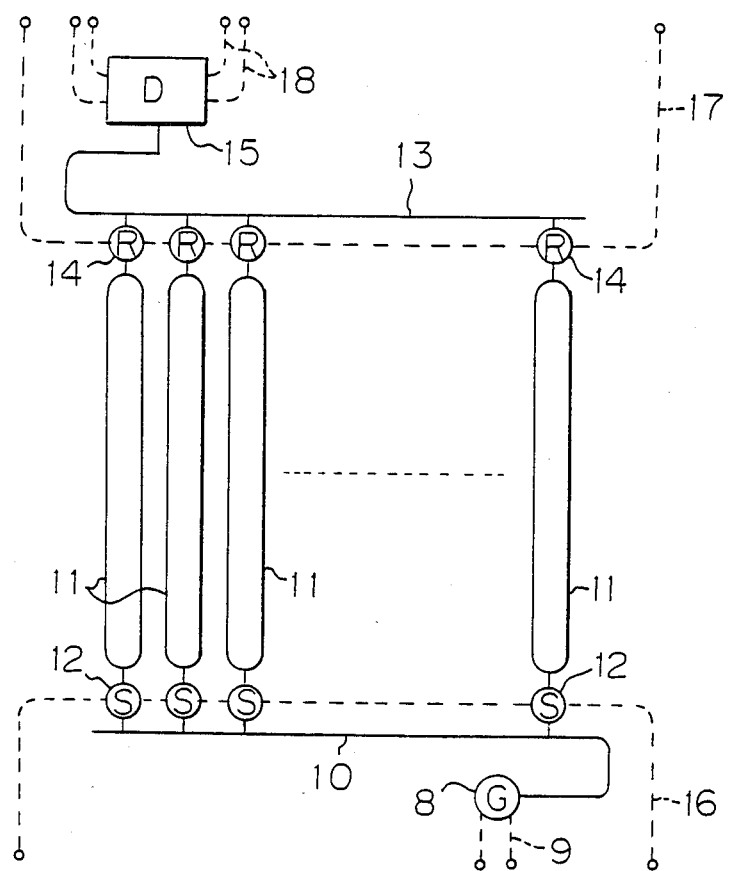
FIG. 2 is a schematic diagram for the device of FIG. 1.
Figure 3:
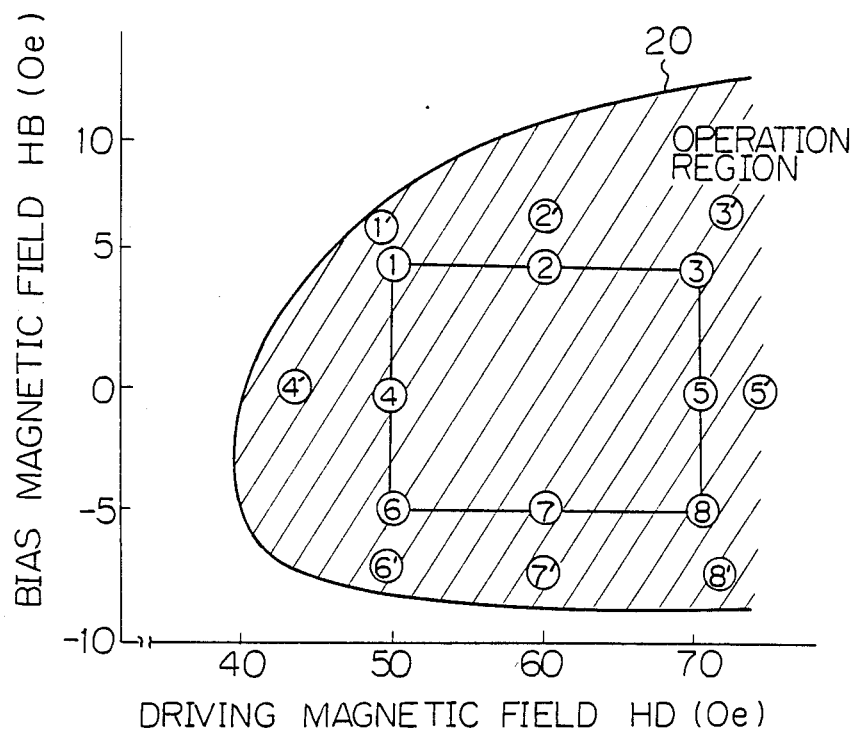
FIG. 3 illustrates an operating region for a magnetic bubble memory device.
Figure 4:
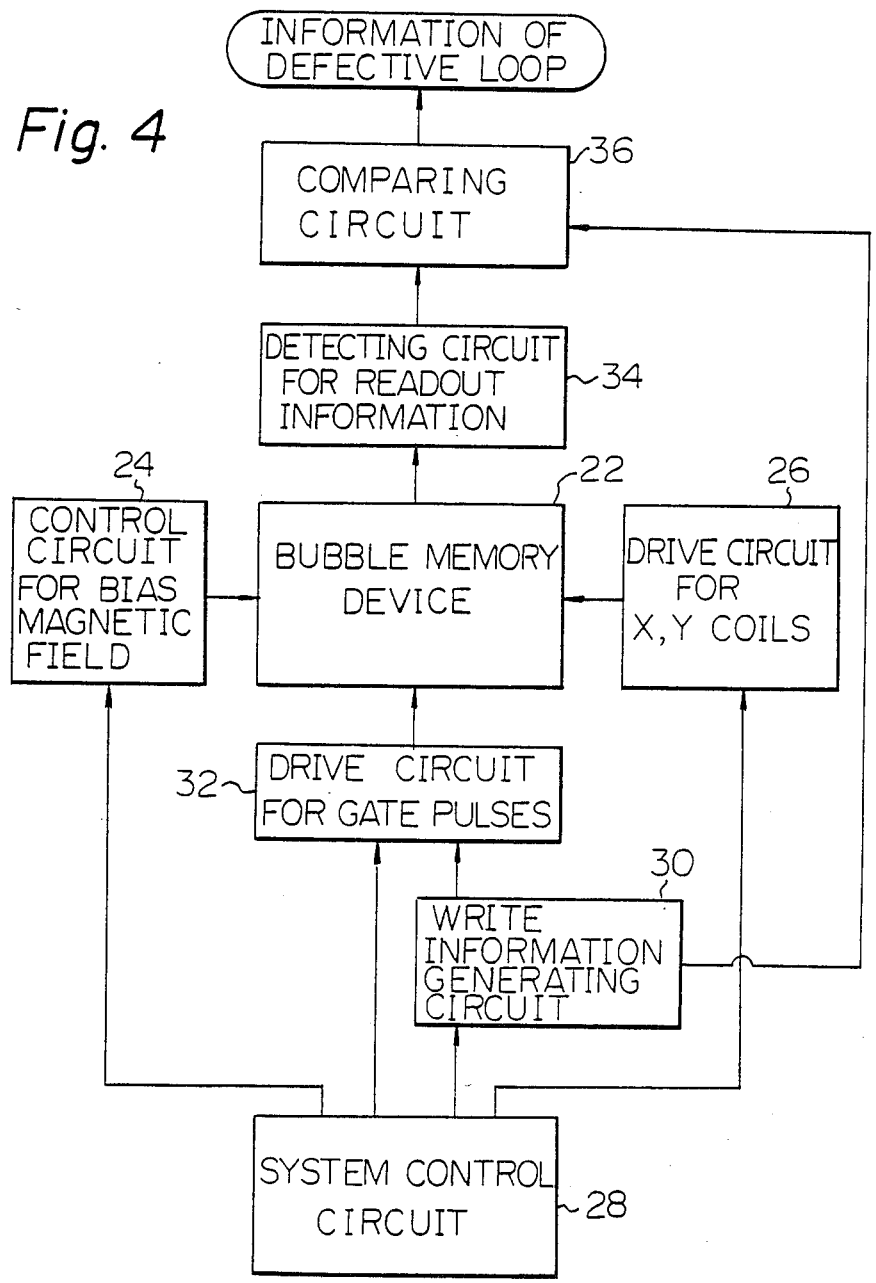
FIG. 4 is a block diagram of an apparatus for testing a magnetic bubble memory device.
Figure 5:
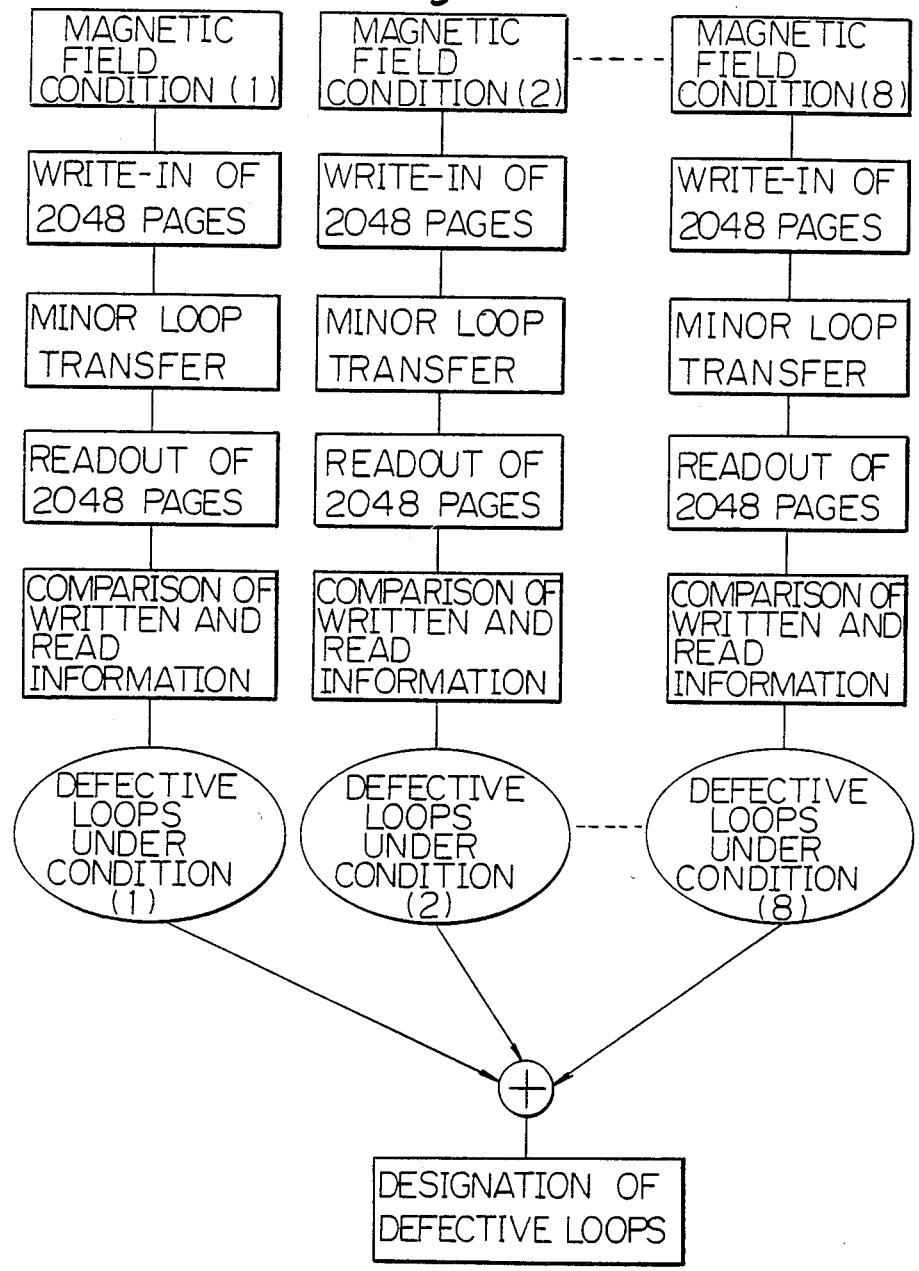
FIG. 5 is a flow diagram illustrating a conventional method for detecting defective loops.
Figure 6A:
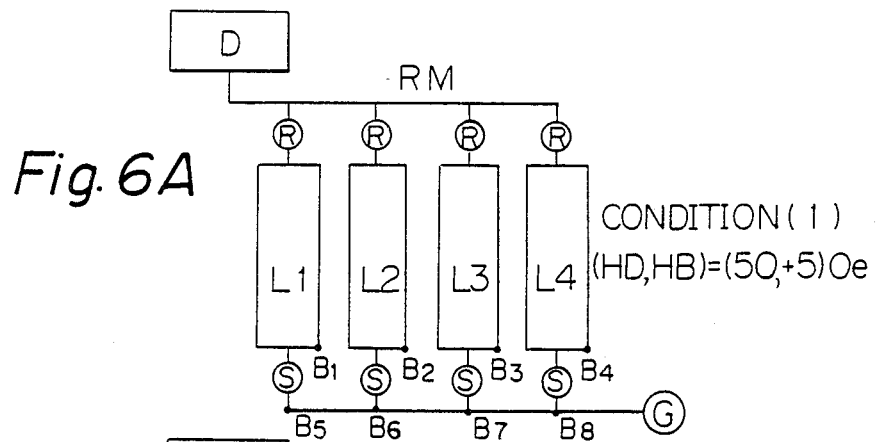
FIGS. 6A through 6C, FIGS. 7A through 7C, and FIGS. 8A through 8C are block diagrams illustrating a method for testing magnetic bubble memory devices according to the present invention.
Figure 6B:
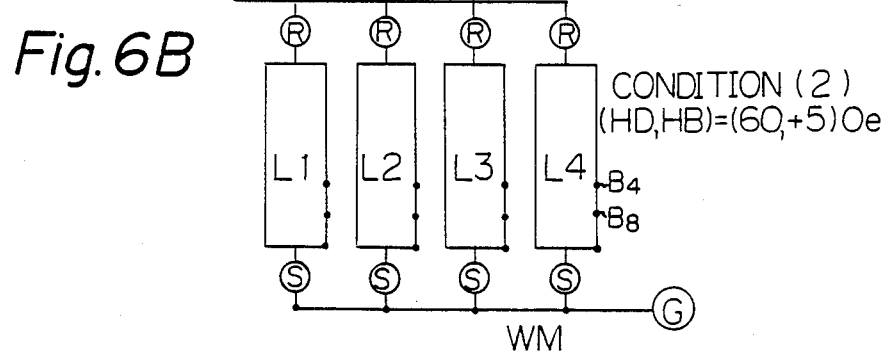
Figure 6C:
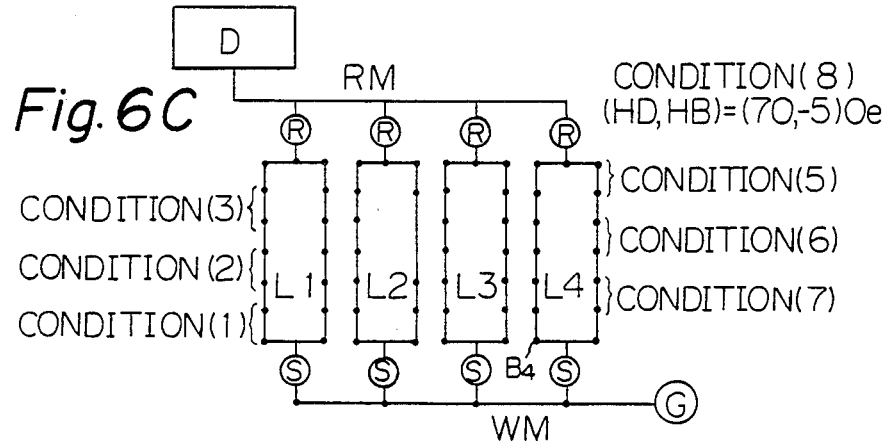

FIGS. 6A through 6C illustrate the first step of the test, that is, the writing step. At first, as is shown in FIG. 6A, under the driving and bias magnetic field condition (1) of (HD, HB)=(50, +5) Oe, as shown in FIG. 3, four bubbles B1 through B4 are generated by the generator G, and the swap gates S are actuated at an appropriate timing to write the bubbles one by one into each of the minor loops L1 through L4 (i.e., the bubbles corresponding to "one page"). Similarly, bubbles B5 through B8 for the next page (second page) are generated under condition (1) and are written into the minor loops. FIG. 6A illustrates the state just before the bubble information for the second page is written into the minor loops from the swap gates. These first and second pages are inclusively called the "first block". Then, as is shown in FIG. 6B, bubbles for the third and fourth pages (second block) are written into the minor loops L1 through L4 using similar procedures under but, a driving and bias magnetic field condition (2) of (HD, HB)=(60, +5) Oe, as shown in FIG. 3.

In a similar manner, bubbles for the fifth and sixth pages (third block), the seventh and eighth pages (fourth block), . . . and the fifteenth and sixteenth (eighth block) are written into the minor loops L1 through L4 under conditions (3), (4), . . . and (8) shown in FIG. 3. Thus, in this example, the bubble information is written into all of the pages of the device; that is, into all of the bit positions in the minor loops. If the swap gate S of the second loop L2 is defective and is not actuated under condition (6), as is shown in FIG. 6C, no bubbles exist for the pages of the second loop L2 which should have been written under condition (6); that is, pages 11 and 12 (sixth block).

Figure 7A:
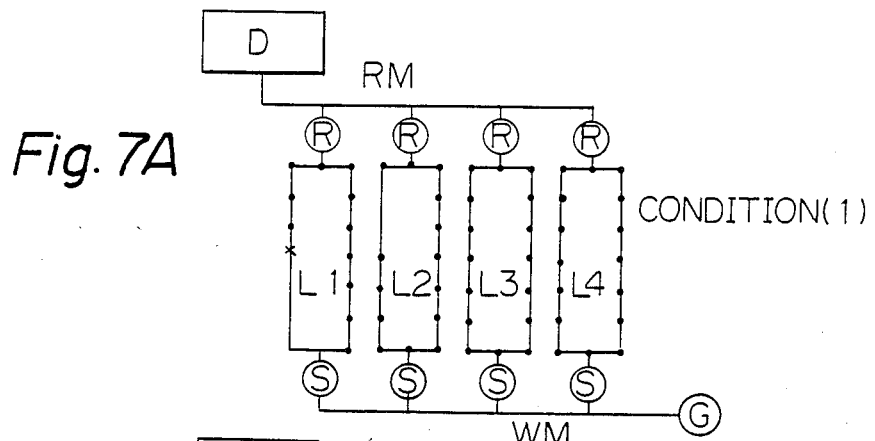
Figure 7B:
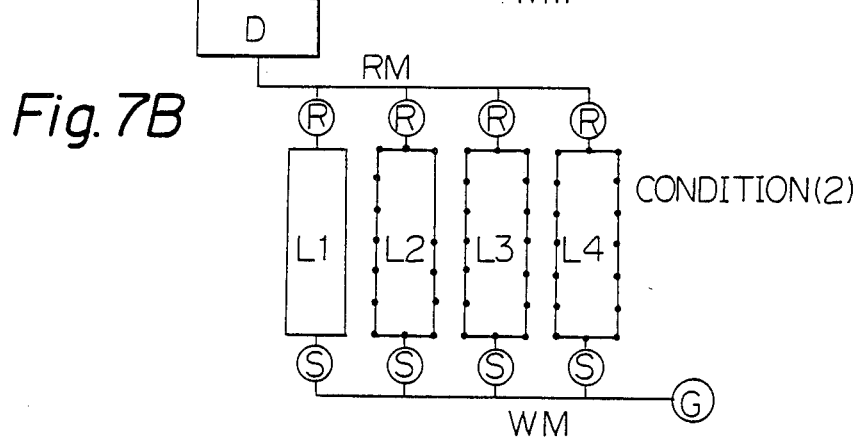
Figure 7C:
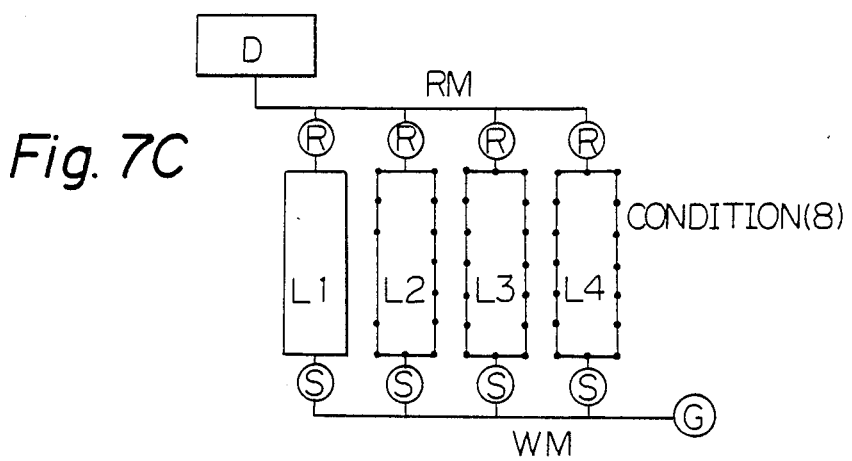

The second step, that is, the minor loop transfer test step, will now be described with reference to FIGS. 7A through 7C. In the second step, the driving and bias magnetic field condition (1), shown in FIG. 3, is applied first, and bubbles are transferred while repeating the stopping and starting operations. Then the bias and driving conditions are changed in sequence to those shown in FIG. 3, i.e., to (2), (3), . . . and (8) in sequence, and the transfer operation is similarly carried out. FIG. 7A shows the test under condition (1), FIG. 7B shows the test under condition (2), and FIG. 7C shows the test under condition (8). In this example, since the bubble information is written into all of the pages, not only is the bubble information in an apparently defective loop (defective irrespective of the condition) different but, also the bubble information written into a loop which becomes defective when bubbles are stored under a specific driving magnetic field and bias magnetic field condition or when the stopping and starting operation is repeated under such a specific condition is different than the desired written information. The point X in the first loop L1 shown in FIG. 7A is defective in that bubbles disappear if the stopping and starting operation of bubble transfer is conducted under condition (1). If there is such a defect in a loop when bubble transfer in the minor loop is conducted by repeating the stopping and starting operation under condition (1), all of the bubbles within this loop disappear at the above-mentioned point X while no loops become defective under any of the other conditions (2) through (8) in this example. Because the defect in loops L1 is caused under condition (1), the bubbles in loop L1 disappear. Although bubbles do not disappear in loop L2 due to the transfer of bubbles in the minor loop, since writing under condition (6) has been effected normally at the writing test shown in FIG. 6C, there exist no bubbles in these portions of loop L2.

Figure 8A:
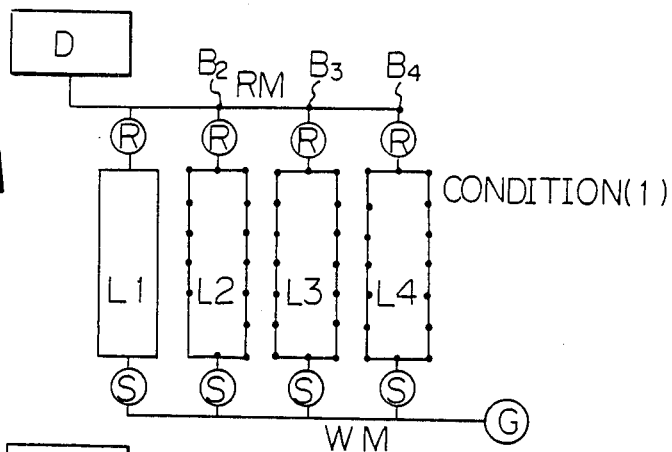
Figure 8B:
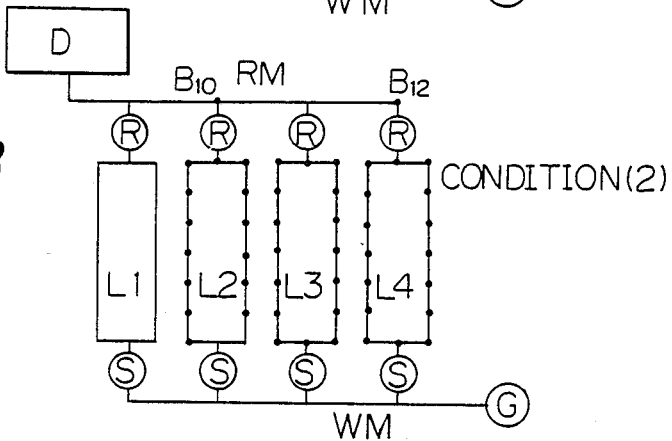
Figure 8C:
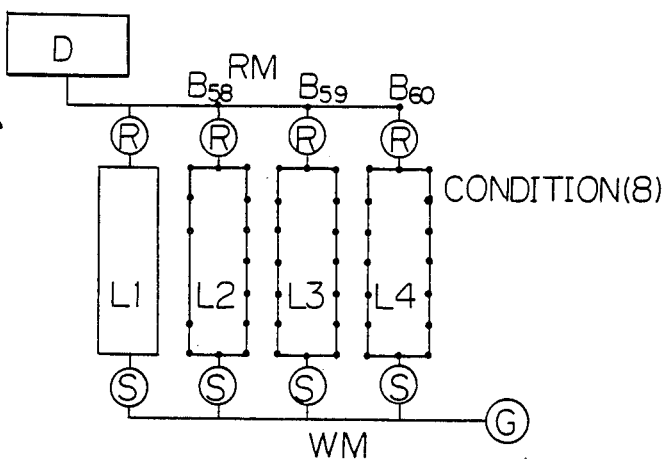

The third step, that is, the reading step, will now be described with reference to FIGS. 8A through 8C. At this step, the bubble information of the first block (pages 1 and 2) is first read out under condition (1) in a manner similar to the first step. $B_2$, $B_3$, and $B_4$ in FIG. 8A designate the bubbles of page 1 replicated and fed to the major line RM. Since no bubbles exist in the first loop L1, bubble B1 of page 1 is not shown. Accordingly, the row of read bubbles of each of the pages 1 and 2 becomes 0,1,1,1. Then the bubbles of the second block (pages 3 and 4) are read out under condition (2). If the replicator of the third loop L3 is not actuated under condition (2) as is shown in FIG. 8B, the row of read bubbles of each of the pages 3 and 4 becomes 0,1,0,1. The reading operation is similarly caried out in sequence under conditions (3), (4) . . . and (8). Reading under condition (8) is shown in FIG. 8C. In this example, a defect occurs only in the replicator of the third loop L3 under condition (3). No defect occurs in any of the other loops.

The bubble information read out through the above procedures is compared with the written information. The results shown below are obtained.

TABLE

| Page | Loop | | | | Writing Condition |
| --- | --- | --- | --- | --- | --- |
| | No. 1 | No. 2 | No. 3 | No. 4 | |
| Written Information | | | | | |
| 1 | 1 | 1 | 1 | 1 | (1) |
| 2 | 1 | 1 | 1 | 1 | (1) |
| 3 | 1 | 1 | 1 | 1 | (2) |
| 4 | 1 | 1 | 1 | 1 | (2) |
| . | . | . | . | . | . |
| . | . | . | . | . | . |
| . | . | . | . | . | . |

TABLE-continued

| | | | | | |
|---|---|---|---|---|---|
| 15 | 1 | 1 | 1 | 1 | (8) |
| 16 | 1 | 1 | 1 | 1 | (8) |

| | Loop | | | | Reading |
|---|---|---|---|---|---|
| Page | No. 1 | No. 2 | No. 3 | No. 4 | Condition |
| Read Information | | | | | |
| 1 | 0 | 1 | 1 | 1 | (1) |
| 2 | 0 | 1 | 1 | 1 | (1) |
| 3 | 0 | 1 | 0 | 1 | (2) |
| 4 | 0 | 1 | 0 | 1 | (2) |
| 5 | 0 | 1 | 1 | 1 | (3) |
| 6 | 0 | 1 | 1 | 1 | (3) |
| . | . | . | . | . | . |
| . | . | . | . | . | . |
| . | . | . | . | . | . |
| 11 | 0 | 0 | 1 | 1 | (6) |
| 12 | 0 | 0 | 1 | 1 | (6) |
| . | . | . | . | . | . |
| . | . | . | . | . | . |
| . | . | . | . | . | . |
| 15 | 0 | 1 | 1 | 1 | (8) |
| 16 | 0 | 1 | 1 | 1 | (8) |

Although "1" was written into each location of all of the loops, the read information is "0" in all of the pages in the first loop L1, "0" in pages 11 and 12 in the second loop L2, and "0" in pages 3 and 4 of the third loop L3. From this discrepancy between the read information and the written information, the first, second, and third loops are determined to be defective. On the other hand, in the fourth loop, the written information coincides with the read information in all of the pages, and it is therefore determined to be a normal loop.

As is apparent from the foregoing description that according to the present invention, the logic sum of defective minor loops under different conditions can be detected by comparing the written information with the read information. Of course, the genetic results of writing, transfer, and reading are detected but, the results of the respective tests of writing, transfer, and reading under independent conditions (1), (2), . . . are not detected. However, in the product test it is sufficient if all disorders are detected as a generalized defect.

Figure 9:
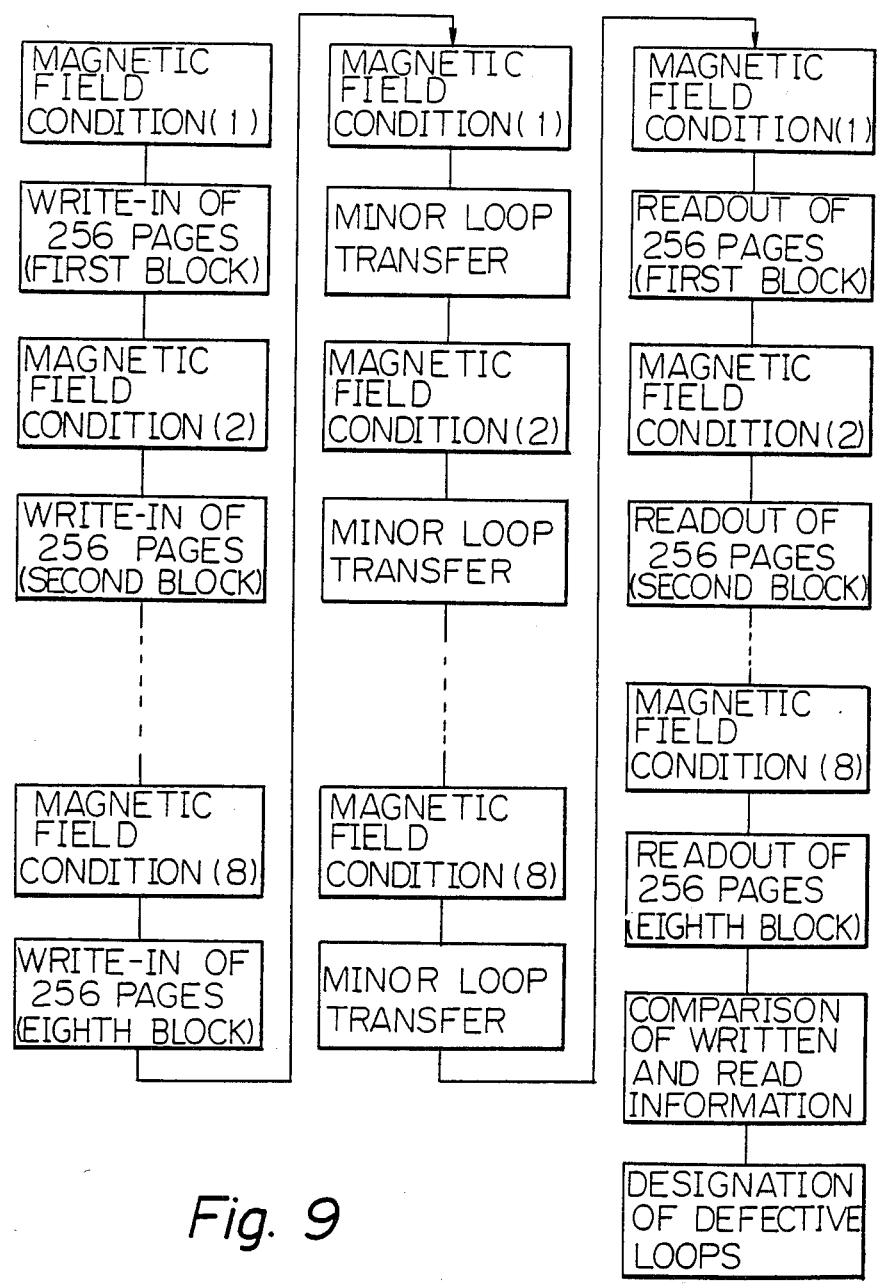
FIG. 9 is a flow diagram illustrating the test sequence of a method for testing magnetic bubble memory devices according to the present invention.

FIG. 9 illustrates an embodiment in which the present invention is applied to a 1-megabit device and in which the window test area shown in FIG. 3 is employed. The 1-megabit device has about 600 loops, each loop having about 2,048 bits. The first step, that is, the writing step, will now be described. As is shown in the upper left portion of FIG. 9, the driving magnetic field and the bias magnetic field are set at condition (1), that is, (HD, HB)=(50, +5) Oe, and since there are eight different conditions, 256 pages (2,048/8) are written in sequence under condition (1) into the minor loops (first block). Then the driving magnetic field and the bias magnetic field are set at condition (2); that is, (HD, HB)=(60, +5) Oe, and 256 pages of the second block are written into the minor loops in sequence. Next, the driving magnetic field and the bias magnetic field are set at condition (3); that is, (70, +5) Oe, and 256 pages of the third block are written into the minor loops. In this manner, blocks of bubble information (each including two 256 pages) is written in sequence under the eight conditions shown in FIG. 3. In the state where writing under condition (8) is completed and the information of 2,048 pages (=256×8) is written into the minor loops, bubbles of the respective blocks are generated, passed through the swap gates, and are transferred in the minor loops under different driving magnetic field conditions and/or bias magnetic field conditions. Namely, each swap gate is tested under the eight conditions (1) through (8), and bubbles written under the eight driving magnetic field and bias magnetic field conditions exist in each minor loop. If the swap gate portion of a certain loop is defective and is not actuated under any of the conditions (1) through (8), bubble information in this loop is stored different than the desired written information at this step.

The second step will now be described. At the second step illustrated in the central portion of FIG. 9, the driving magnetic field and the bias magnetic field are set at condition (1), and all of the bubbles are transferred in the minor loops while repeating the stopping and starting operations. Then the condition is changed to (2), (3), . . . and (8) in sequence, and the transfer operation is similarly carried out under each condition. In this embodiment, the bubble information of 2,048 pages, that is, substantially all of the pages, is written into the minor loops. Accordingly, not only is the bubble information of an apparently defective loop different but, also the bubble information of a defective loop which operates erroneously when bubbles are stored under any of the above-mentioned driving magnetic field and bias magnetic field conditions or when the stopping and starting operations are repeated under any such condition is different than the desired written information.

The third step will now be described. At this step, illustrated at the right hand side of FIG. 9, the bubble information of 256 pages of the first block is read out under condition (1). Then the bubble information of 256 pages of the second block, 256 pages of the third block, . . . are respectively read out under conditions (2), (3), . . . in sequence from the minor loops. The first, second, . . . blocks read during the reading step need not correspond to the first, second, . . . blocks at the writing step. If the replicator portion of a certain loop is defective and does not operate normally under any of the conditions (1) through (8), the bubble information at the position corresponding to this loop is different than the desired written information.

The time required for the writing operation is 12 seconds ( 10 μS×600 loops×256 pages×8), the time required for the minor loop transfer is three seconds, and the time required for the reading operation is 12 seconds (10 μS×600 loops×256 pages×8). Therefore, the total time required for completion of the above-mentioned three steps is 27 seconds (=12+3+12). In this case, the time required for changing the driving magnetic field and bias magnetic field conditions is less than several miliseconds and can be ignored. Namely, the test time can be reduced to one eighth the test time required in the conventional test method, wherein the writing and reading of all of the pages should be carried out under every condition.

The bubble information read out through the above-mentioned three steps is compared with the desired written information, and when bubble information of at least one bit which does not coincide with the desired written information is detected, the minor loop providing this information is determined to be defective.

As is apparent from the foregoing description, according to the present invention, the conditions are changed to all of the required conditions while writing into and reading out of all of the pages is conducted. Accordingly, defective loops under all of the required conditions can be detected in a time period substantially equal to that required for detection of defective loops under only one condition in the conventional test method. The simplest test sequence in the 1-megabit device has been described in the above embodiment. Needless to say, the present invention can be applied to a complicated test sequence irrespective of the capacity of the device. Although a window test conducted at eight points has been described in the above embodiment, the present invention is not limited to these conditions and can be applied to the detection of defective loops under other driving magnetic fields and/or bias magnetic fields. For convenience of illustration, the order of the driving magnetic field and bias magnetic field conditions is set at (1), (2), . . . and (8). However, this order is not particularly critical and can be changed at either the writing step, the minor loop transfer step, or the reading step. Moreover, the writing operation, the transfer of bubbles in minor loops, and the reading operation may be conducted under different driving magnetic field and bias magnetic field conditions, respectively. This is especially true during the transfer of data in the minor loops, the loops being the information-storing areas. During the transfer it is possible to conduct a window test over a broader region defined by (1'), (2'), . . . and (8') as shown in FIG. 3 and to detect loops having a margin smaller than the average margin, that is, so-called weak loops. This method is effective for increasing the stability of the stored information.

In the above-mentioned method, the conditions of the magnetic field are changed over all of the conditions necessary to test within a write-in and readout operation cycle. However, it is also possible to change the conditions of the magnetic field within a plurality of write-in and readout operation cycles. In this case though, the test time becomes a multiple of that of the former method. However, the test time can still be much shorter than that of the conventional method.

Also, it is preferable to first detect defective minor loops under stronger bias field conditions, for example, conditions (1), (2), and (3) or conditions (4) and (5) of FIG. 3, and thereafter detect defective minor loops under weaker bias field conditions, for example, conditions (6), (7), and (8) of FIG. 3 without writing bubble information into the defective minor loops detected under the stronger bias field conditions. This alternative can be used because if the bubble device has a defective minor loop or loops which erroneously generate a bubble or bubbles, the defective minor loop or loops may generate many bubbles under weak bias field conditions and may also spread the bubbles to adjacent loops or peripheral loops as well as to the defective loop or loops themselves, thereby making a normal loop or loops abnormal. If such a defective loop or loops are detected under stronger bias field conditions and/or medium-strength bias field conditions and bubble information written into the defective loop or loops is masked or erased, the above-mentioned scattering of bubbles does not occur under weaker bias field conditions and the peripheral loops are not affected by the defective loop or loops.

According to the present invention, all loops that are defective under many driving and bias magnetic field conditions can be detected in a time substantially equal to the time required for detection of defective loops under only one driving magnetic field and bias magnetic field condition in the conventional test method. Accordingly, it is possible to drastically shorten the test time. Of course, instead of the above-mentioned method in which the conditions are changed to all of the required conditions at the writing and reading steps, a method can be employed in which this change of conditions is divided into parts. In this case, the test time becomes a plurality multiple of the time required in the above-mentioned case, but the test time is still much shorter than the test time required in the conventional method.

What is claimed is:

1. A method of testing a bubble memory device having a plurality of minor loops and an operating region, the method comprising the steps of:
   (a) dividing data to be written into the bubble memory, into a plurality of blocks and writing this data into the bubble memory under different operating conditions for respective ones of said blocks;
   (b) operating said bubble memory device sequentially under different operating conditions within said operating region for respective ones of said blocks; and
   (c) detecting a defective minor loop by reading the data blocks stored in the bubble memory under different operating conditions for respective ones of said blocks and comparing the read data with the data to be written into the bubble memory.

2. A method according to claim 1, wherein step (a) includes
   (i) dividing each block of bubble information into a plurality of pages,
   (ii) writing the pages into said minor loops under said different operating conditions with said operating region for respective ones of said blocks; and step (b) includes
   (i) transferring the written pages within said minor loops under said different operating conditions within said operating region; and step (c) includes
   (i) reading the data stored and transferred within said minor loops, in blocks, each block comprising a plurality of pages, under said different operating conditions within said operating region for respective ones of said blocks.

3. A method according to claim 2, wherein said different operating conditions are changed along the periphery of a predetermined test area within said operating region.

4. A method according to claim 3, wherein said written bubble information is transferred within said minor loops under said different operating conditions which are outside of said predetermined test area and within said operating region.

5. A method according to claim 2, wherein said bubble information written into said minor loops is transferred around said minor loops at least once under the same operating condition.

6. A method according to claim 1 or 2, wherein said operating region includes various bias magnetic field intensities, and said bubble memory device is first tested under relatively strong bias magnetic field conditions to detect defective minor loops and then said bubble memory device is tested under relatively weak bias magnetic field conditions without writing bubble information into said detected defective minor loops detected by testing using said relatively strong bias magnetic field conditions.

7. A method according to claim 1, wherein said different operating conditions are changed along the periphery of a predetermined test area within said operating region.

8. A method of testing a bubble memory device having an operating region and a plurality of minor loops, each of said plurality of minor loops having N storage locations with corresponding storage locations of said plurality of minor loops defining pages of bubble information, said pages being divided into blocks of bubble information comprising a predetermined number of pages, the method comprising the steps of:
   (a) writing blocks of desired bubble information into the minor loops under different operating conditions within said operating region for respective ones of said blocks;
   (b) transferring said blocks of bubble information in the minor loops under different operating conditions within said operating region;
   (c) reading respective ones of side blocks of bubble information from the minor loops under different operating conditions within said operating region; and
   (d) comparing said desired bubble information with said read blocks of bubble information to detect defective minor loops.

9. A method of testing a bubble memory device according to claim 8, wherein, in steps (a), (b) and (c), said different operating conditions within said operating region are different for each block.

10. A method of testing a bubble memory device according to claim 9, wherein step (b) includes the step of intermittently stopping said transferring of said blocks of bubble information.

11. A method of testing a bubble memory device according to claim 8, wherein said different operating conditions are within a specified region within said operating region.

12. A method of testing a bubble memory device according to claim 8, wherein step (b) includes the step of intermittently stopping said transferring of said blocks of bubble information.

13. A method of testing a bubble memory device according to claim 8, 9 or 12, wherein side different operating conditions include various bias magnetic field intensities, said method including:
   (i) performing steps (a) thru (d) using a first bias magnetic field intensity;
   (ii) performing step (a) using a second bias magnetic field intensity being less than said first bias magnetic field intensity and writing only in non-defective loops; and
   (iii) performing steps (b) thru (d) using said second bias magnetic field intensity.

14. A method of testing a bubble memory device according to claim 9, wherein said different operating conditions are within a specified region within said operating region.

15. A method of testing a bubble memory device according to claim 11, wherein, in steps (a) and (c), said different operating conditions are within said specified region, and in step (b), said different operating conditions are within said operating region and outside of said specified region.

* * * * *

UNITED STATES PATENT AND TRADEMARK OFFICE
CERTIFICATE OF CORRECTION

PATENT NO. : 4,592,052
DATED : MAY 27, 1986
INVENTOR(S) : SEIICHI IWASA

It is certified that error appears in the above-identified patent and that said Letters Patent is hereby corrected as shown below:

FRONT PAGE [56] References Cited, "10/1980" should be --11/1980--.

Col. 2, line 64, "prcisely" should be --precisely--.

Col. 3, line 40, after "sequence" insert --,--.

Col. 4, line 26, "differnet" should be --different--.

Col. 5, line 50, "under but," should be --but, under--;
line 66, after "second" insert --test--; and "transfer test" should be --transfer--.

Col. 6, line 5, delete "in sequence";
line 28, "loops" should be --loop--;
line 53, "(3)" should be --(2)--.

Col. 11, line 16, "side" should be --said--.

Signed and Sealed this

Second Day of September 1986

[SEAL]

Attest:

DONALD J. QUIGG

Attesting Officer

Commissioner of Patents and Trademarks